US 6,742,165 B2

(12) United States Patent
Lev et al.

(10) Patent No.: US 6,742,165 B2
(45) Date of Patent: May 25, 2004

(54) SYSTEM, METHOD AND COMPUTER PROGRAM PRODUCT FOR WEB-BASED INTEGRATED CIRCUIT DESIGN

(75) Inventors: Lavi A. Lev, Saratoga, CA (US); David A. Courtright, Los Gatos, CA (US); John B. Knowles, Santa Barbara, CA (US); Darren M. Jones, Los Altos, CA (US)

(73) Assignee: MIPS Technologies, Inc., Mountainview, CA (US)

( * ) Notice: Subject to any disclaimer, the term of this patent is extended or adjusted under 35 U.S.C. 154(b) by 190 days.

(21) Appl. No.: 09/818,946

(22) Filed: Mar. 28, 2001

(65) Prior Publication Data

US 2002/0144212 A1 Oct. 3, 2002

(51) Int. Cl.[7] .............................................. G06F 17/50
(52) U.S. Cl. ................................ 716/1; 716/8; 716/18
(58) Field of Search ...................... 716/1–18; 709/217

(56) References Cited

U.S. PATENT DOCUMENTS

| 6,226,412 | B1 | * | 5/2001 | Schwab ...................... 382/232 |
| 6,292,827 | B1 | * | 9/2001 | Raz ............................. 709/217 |
| 6,324,672 | B1 | * | 11/2001 | Lawman et al. ................ 716/1 |
| 6,370,678 | B1 | * | 4/2002 | Culler .......................... 716/18 |
| 2002/0038401 | A1 | * | 3/2002 | Zaidi et al. .................. 710/305 |

OTHER PUBLICATIONS

Linda Geppet, "The Rising Tide of Web–Based Tools and Services Augurs The Next Sea Change in Electronic Design, IC Design on the World Wide Web," IEEE, Jun. 1998, pp. 45–50.*

Schindler et al, "IP Repository, A Web Based IP Reuse Infrastructure," IEEE, May 1999, pp. 415–418.*
Wieslaw Kuzmicz, "Internet–Based Virtual Manufacturing: A Verification Tool for IC Design," Mar 200, pp. 1–5.*
Marinova et al, "A Distributed System for Circuit Simulation," IEEE, Sep. 2001, pp. 467–470.*
IBM Unveils Internet–Based Chip Design Tool, printed from http://www.electronicnews.com/enews/news/6421-57NewsDetail.asp (Feb. 26, 2001).
Moretti, G., "*EDA On The Internet:*", EDN, www.ednmag.com, Sep. 28, 2000, pp. 58–60, 62, 64, 66, 68, 70 and 72.
Paul, L.G. "*The ASP Dilemma*", Electronic News, Cahners Business Information, May 2, 2000, 4 pages.
"*UMC, Synopsys and Virtual Silicon Collaborate to Help Customers Get From Design Specification to Silicon More Quickly*EDA Tools and Libraries Target UMC's WorldLogic[SM] 0.13 micron Process Technology," Apr. 9, 2001, retrieved from the Internet on Apr. 10, 2001<URL:http://www.synopsys.com/news/announce/press2001/snps_ume_pr.html>, 3 pages.

* cited by examiner

Primary Examiner—Vuthe Siek
(74) Attorney, Agent, or Firm—Sterne, Kessler, Goldstein & Fox, P.L.L.C.

(57) ABSTRACT

A Web-based integrated circuit design system, method and computer program product tool allows design engineers to utilize a well-understood graphical interface (i.e., a Web browser) to access a wealth of data and services. The services and data include competing standard architectures and reference designs. The integrated circuit design tool allows users (e.g., design engineers) to efficiently design cores and systems-on-a-chip (SOCs). The integrated circuit design tool is a "virtual lab" which allows and aides design engineers at every stage of IC product design—architecture choice, implementation options, software development, and hardware design.

22 Claims, 8 Drawing Sheets

SYSTEM, METHOD AND COMPUTER PROGRAM PRODUCT FOR WEB-BASED INTEGRATED CIRCUIT DESIGN

BACKGROUND OF THE INVENTION

1. Field of the Invention

The present invention relates generally to computer network applications, and more particularly to computer network applications which facilitate the design of integrated circuits.

2. Related Art

In today's technological climate, there is a continuing advancement in computing technology and processing power, as well as the increased availability of computing facilities and platforms. Despite such computing technology progress, however, the process of designing integrated circuits has remained stagnant. That is, today's engineers still undergo a mostly manual process when designing and testing integrated circuits (or "chips") for use in electronic products.

In general, the chip design process can be viewed and explained as a series of six sequential phases: (1) system architecture exploration; (2) software development; (3) design; (4) verification; (5) synthesis, layout and static timing analysis (STA); and (6) auto test pattern generation (ATPG).

First, in the system architecture exploration phase, a chip designer explores different system architectures. Depending on the requirements of the system (i.e., the product) for which the chip is being designed, the chip designer may need to analyze any or all of the following factors: frequency/performance; bus bandwidth and latency; interrupt latency; memory latency and bandwidth; cache size; and software compatibility. Today, much of this is done manually, although using a cycle-accurate simulator sometimes helps. With the advent of multi-million gate SOC ("system on chip" or application specific integrated circuit (ASIC)) designs, the above analyses may be required for multiple cores on a chip.

Second, in the software development phase, the designer makes hardware/firmware/driver determinations for the system. Many different methodologies are now employed. Often, the chip design engineer needs actual hardware to do software development. If this is the case, they must decide whether to purchase standard boards or wait until their chip is actually manufactured before starting software design. In many cases, design engineers desire to start software development simultaneously with hardware development. Conventional tools exist that model hardware behavior in order to enable early software design. Many of these are part of an integrated software development environment (IDE) that offers project management, compilation control and debug functionality. These tools, however, are stand-alone and not integrated into the other five phases of chip design.

Third, in the design phase, the actual register transfer level (RTL) design is typically done as a manual process using pencil and paper, or some computer screen editor (e.g., Emacs). In some cases, a graphical interface may be used to design state machines using state transition diagrams. As will be appreciated by one skilled in the relevant art(s), a state transition diagram consist of circles to represent states and directed line segments to represent transitions between the states, wherein one or more actions (outputs) may be associated with each transition.

Fourth, in the verification phase, design engineers typically utilize simulators to "load" the developed software onto the designed hardware (i.e., the chip). The verification phase, in essence, involves the design engineer determining if the chip functions as called for in the design specification. Such functional verification is computer intensive. Generally speaking, the chip designer submits their design and then executes some type of electronic design automation (EDA) tool (e.g., simulators, formal verifiers or code linters). After the EDA tool is executed, the engineer analyzes the results. These results are in the form of text log files and result files. Then, graphical waveform viewing is also often done after simulations. One shortcoming of this process is that the design engineer must manually submit designs as well as manually verify the rest of the chip design, then manually build a simulation engine. More experienced engineers find this process relatively simple, yet error prone. More novice design engineers, however, find a need to keep careful notes given that the process is fairly detailed and manual.

Fifth, in the synthesis, layout and STA (collectively referred to as the "back-end") phase, the following user inputs are required: the design database (i.e., the RTL module files); synthesis constraints and compile options; and a floor plan (typically the most important user input to layout and is generated using graphical EDA floor planners). The synthesis is the translation of the RTL to actual logic gate implementations. The layout refers to the actual physical placement of gates onto the silicon wafer. STA is the timing verification of the chip (i.e., "how fast does it run?"). For most projects, synthesis, layout and STA are computationally intensive tasks with little user interaction. Initially, default synthesis constraints can be used. After that, constraint optimization is mostly done manually, although it can be automated. Most typically, default compile options can be used, although the design engineer may sometimes make manual tweaks. Today, synthesis, layout and STA are typically done by scripts specifically created for each design project.

Sixth, in the ATPG phase, a test sequence is generated. This test sequence is designed in order to test the chip once it has been fabricated (e.g., testing for "stuck-at zero" or "stuck-at one" faults in a CMOS chip). The ATPG phase is another design step that is computationally intensive. As done today, it requires the final net list as input with some small user input file. After the test sequence is executed, an engineer analyzes the output log files to see if any improvements can be made in the design.

The final output of the design process is typically a magnetic tape ("tape-out") in the GDSII binary format (developed by Cadence Design Systems, Inc. of San Jose, Calif.), which can then be sent by the design engineer to a foundry for actual fabrication of the chip.

The design flow for an integrated circuit is described in more detail in Michael J. S. Smith, "Application Specific Integrated Circuits," Addison-Wesley, ISBN 0-201-50022-1 (USA 1997), which is incorporated herein by reference in its entirety.

In sum, the six-phase chip design process explained above is complex and time-consuming. While automated tools exist for certain stages of design (e.g., the Design Compiler™ tool, available from Synopsys, Inc. of Mountain View, Calif. for synthesis and the FastScan™ tool, available from Mentor Graphics Corp. of Wilsonville, Oreg. for ATPG), no single integrated tool is currently available to aide engineers at every stage of product design (i.e., from conception to tape-out).

Given the foregoing, what is needed is a system, method and computer program product for a total integrated circuit design tool.

SUMMARY OF THE INVENTION

The present invention, which meets the above-identified need, is a system, method and computer program product for total Web-based integrated circuit design. The present invention allows design engineers to utilize a well-understood graphical interface (i.e., a Web browser) to access a wealth of data and services. The present invention allows designers to evaluate and choose competing standard architectures, and to more efficiently design cores and systems-on-a-chip (SOCs). In essence, the present invention is a "virtual lab" which allows and aides design engineers at every stage of product design. This includes, without limitation, architecture choice, implementation options, software development, and hardware design.

The system of the present invention includes an application database that stores information about users of the system and reference designs for integrated circuits. The system also includes a plurality of servers, each connected to the application database, that possess the code logic necessary to provide the virtual lab functionality described herein while accessing the application database. A gateway (i.e., a Web server) is also included which services connections (e.g., Web connections) from a plurality of geographically remote user machines over at least a portion of the Internet. The system also includes means for allowing the plurality of user machines to perform all phases of integrated circuit design by communicating with one of the plurality of servers via the gateway and a graphical user interface.

The method and computer program product of the present invention involve receiving from the user a selection indicative of an application for which the user is designing an integrated circuit (IC). Next, the application database is accessed in order to retrieve reference designs for the selected application.

Then, the user selects, via the graphical user interface (which is provided to the user over at least a portion of the Internet), one of the reference designs for the application. Once a reference design is selected, the user is provided, via the graphical user interface, a system simulation tool, which allows the user to select, simulate and prototype the hardware, software and middleware of the IC being designed.

The method and computer program product also provide the user with a chip design flow tool. The tool allows the user to perform register transfer level design, verification, synthesis, layout and static timing analysis of the IC being designed. Next, the user is provided with one or more compiler and debugger tools in order to facilitate the software development of the IC being designed.

One advantage of the present invention is that a company of design engineers can avoid the purchase of expensive tools for each of the six phases of chip design, some of which are going to be used infrequently. Further, the use of the present invention allows smaller companies (e.g., "start-up" companies) to avoid the purchase of several tools and computing facilities, and having to establish design methodologies—all of which smaller, newer companies have difficulty doing due to limited capital and inexperience.

Another advantage of the present invention is that can be utilized for "platform-based" SOC design where a design engineer is presented with several reference design choices that may be, for example, further integrated or modified, as well as "block-based" SOC design where the design engineer is presented with a list of several design components that may be used to construct a system from scratch (rather than reference designs).

Another advantage of the present invention, as to the system architecture exploration phase, is that a designer can use the Web to "drag and drop" several cores into a design, upload software or a benchmark, and then simulate the system assuming some interconnection scheme. In essence, the present invention allows a chip designer to "try before they buy."

Another advantage of the present invention, as to the software development phase, is that by making the functionality described herein available over the Web, design engineers save time and energy by not having to install and maintain the software or computer servers used for simulation. That is, an application service provider (ASP) offering the tool of the present invention can make a library of optimized functions available "on-line" thereby giving software developers a "jump start" in industry standard areas like Fast Fourier Transform (FFT), floating point emulation, etc.

Another advantage of the present invention, as to the verification phase, is that the Web can improve these tasks by acting as a "front-end" to a set of common scripts that better manage the entire verification phase process. This can significantly simplify the methods by which engineers design and verify RTL. This would also give novice design engineers a faster learning curve and provide expert design engineers with less opportunities for making oversights. The Web scripts can work closely with a database of circuit verification scripts (CVS) to enable: submission and check-in of designs, release of designs for internal use (i.e., "SILVER tagging"), graduation of designs after regressions (i.e., "GOLD tagging"), check-out of all current modules for simulation, building of custom simulation engines, access to pre-built simulation engines (SILVER and GOLD), submission of standard regressions to a compute farm, submission of single tests to compute farm or local machine, access to simulation/regression results, including waveforms, and submission of new functional tests to the database.

Another advantage of the present invention, as to the synthesis, layout and STA phase, is that the Web can improve the computationally-intensive tasks in the same way it can improve functional verification. That is, it can automate and standardize these steps and give access to shared computer resources. Because the flow is being automated and simplified, this also gives the ASP the opportunity to offer multiple EDA tool options for synthesis and layout. By offering different flows, design engineers can choose the one that best fits their design flow.

Yet another advantage of the present invention, as to the ATPG phase, is that the Web provides an advantage over conventional techniques by automating and standardizing the ATPG process and provides remote access to computer servers.

Further features and advantages of the invention as well as the structure and operation of various embodiments of the present invention are described in detail below with reference to the accompanying drawings.

BRIEF DESCRIPTION OF THE FIGURES

The features and advantages of the present invention will become more apparent from the detailed description set forth below when taken in conjunction with the drawings in which like reference numbers indicate identical or functionally similar elements.

DETAILED DESCRIPTION OF THE PREFERRED EMBODIMENTS

Table of Contents

I. Overview
II. Example System Architecture
III. Application Database
IV. Software Architecture
V. Example System Operation
VI. Environment
VII. Conclusion I. Overview The present invention is a system, method and computer program product for the Web-based integrated circuit design.

In an embodiment of the present invention, an application service provider provides and allows access, perhaps on a subscriber basis, to a total integrated circuit design tool (i.e., a "virtual lab") via the global Internet. That is, the application service provider would provide the hardware (e.g., servers) and software (e.g., database) infrastructure, application software, customer support, and billing mechanism to allow its customers (e.g., chip design engineers and the like) to remotely perform all phases (and aspects) of integrated circuit design.

More specifically, the application service provider would provide a World Wide Web site where a design engineer, using any computing platform and Web browser software, to remotely perform all phases of integrated circuit design as described herein.

As suggested above, in an embodiment of the present invention, an ASP may provide users with access to the integrated circuit design tool of the present invention and charge on a subscriber or per-use basis.

In an alternate embodiment, users may access the integrated circuit design tool of the present invention via direct dial-up lines rather than through the global Internet.

In yet another embodiment of the present invention, the integrated circuit design tool of the present invention, instead of being accessed via the global Internet, would run locally on proprietary equipment and be networked among the local or wide area network (e.g., over an Ethernet, intranet, or extranet) of an entity allowing multiple users (e.g., employees of a single company that owns proprietary equipment) to access and use the integrated circuit design tool of the present invention.

The present invention is described herein in terms of the Web-based chip design example. This is for convenience only and is not intended to limit the application of the present invention. In fact, after reading the following description, it will be apparent to one skilled in the relevant art(s) how to implement the following invention in alternative embodiments (e.g., hardware design in general).

The terms "user," "customer," "design engineer," "engineer," "designer," and the plural form of these terms are used interchangeably to refer to those who would access, use, and/or benefit from the present invention.

II. Example System Architecture

Figure 1:
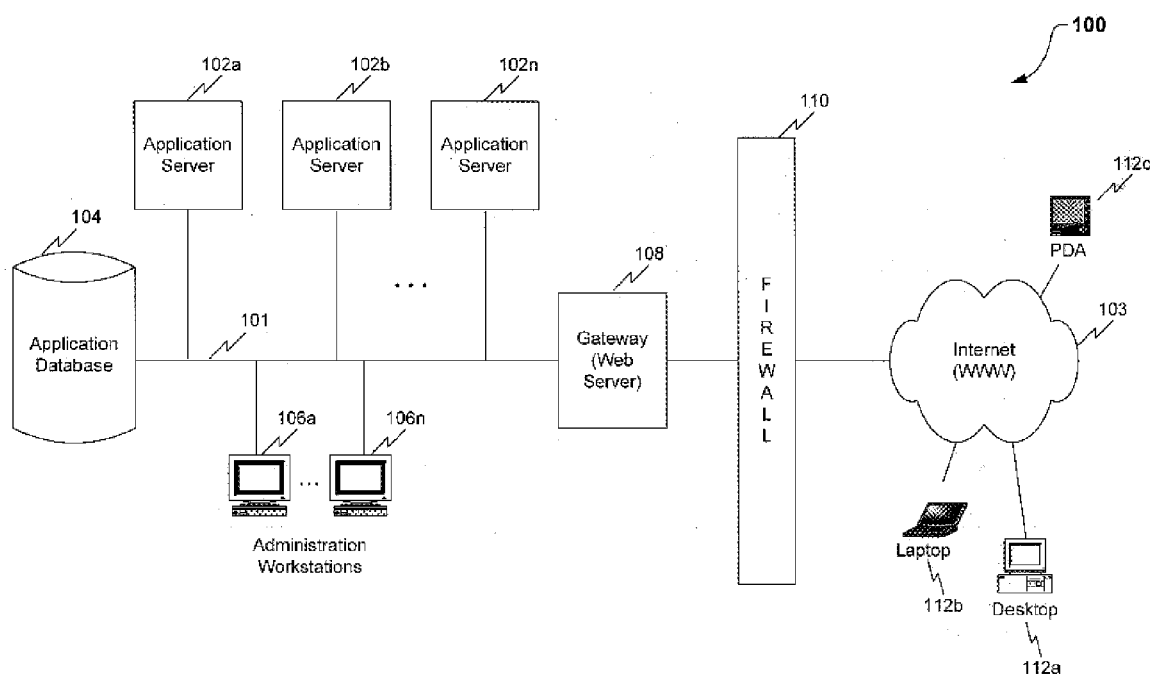
FIG. 1 is a block diagram representing the system architecture of an embodiment of the present invention, showing connectivity among the parts.

Referring to FIG. 1, a block diagram illustrating the physical architecture of a Web-based integrated circuit design (WBICD) system 100, according to an embodiment of the present invention is shown. FIG. 1 also shows connectivity among the various components of WBICD system 100. It should be understood that the particular WBICD system 100 in FIG. 1 (i.e., a integrated circuit design tool system) is shown for illustrative purposes only and does not limit the invention. Other implementations for performing the functions described herein will be apparent to persons skilled in the relevant art(s) based on the teachings contained herein, and the invention is directed to such other implementations.

As will be apparent to one skilled in the relevant art(s), all of the components "inside" WBICD system 100 are connected and communicate via a communication medium such as a local area network (LAN) or a wide area network (WAN) 101 running a secure communications protocol (e.g., 128-bit secure sockets layer (SSL)).

WBICD system 100 includes a plurality of application servers 102 (shown as application servers 102a . . . n) that serve as the processing system of the present invention. Servers 102, as explained in detail below, include the software code logic that implements the integrated circuit design tool operation of WBICD system 100. While a plurality of separate servers are shown in FIG. 1, it will be apparent to one skilled in the relevant art(s) that the WBICD system 100 may utilize one or more servers in a distributed fashion (or possibly mirrored for fault tolerance) connected via LAN 101.

Also connected to LAN 101 is an application database 104. This database, as explained in more detail below, stores information related to the users (e.g., design engineers) utilizing WBICD system 100. Such information includes, as will be appreciated by one skilled in the relevant art(s), user registration, log-ins, passwords, company information, stored project files, account logs and the like.

WBICD system 100 also includes a plurality of administrative workstations 106 (shown as workstations 106a . . . n) that may be used by the WBICD organization (i.e., the ASP) to update, maintain, monitor, and log statistics related to servers 102 and WBICD system 100 in general. Also, administrative workstations 106 may be used "off-line" by ASP personnel in order to enter configuration data, as described below, in order to customize WBICD system 100 performance.

WBICD system 100 also includes a gateway 108 which acts as the interface between the servers 102 and the external (i.e., outside of the ASP's infrastructure) devices. Consequently, gateway 108 is connected to a firewall 110. Generally speaking, a firewall, which is well-known in the relevant art(s), is a dedicated gateway machine with special security precaution software. It is typically used, for example, to service connections and protect a cluster of more loosely-administered machines hidden behind it from an external invasion. Thus, firewall 110 serves as the connection and separation between the LAN 101, which includes the plurality of network elements (i.e., elements 102–108) "inside" of LAN 101, and the global Internet 103 (or some other communications network) "outside" of LAN 101.

Connected to the Internet, outside of the LAN 101, includes a plurality of external computing devices 112 that allow users (i.e., design engineers) to remotely access and use WBICD system 100. External computing devices 112 would include, for example, a desktop computer 112a, a laptop 112b, a personal digital assistant (PDA) 112c.

In one embodiment of the present invention, gateway 108 is a Web server which sends out Web pages in response to Hypertext Transfer Protocol (HTTP) requests from remote browsers (i.e., external computing devices 112). The Web server would provide the "front end" to the users of the present invention. That is, the Web server would provide the graphical user interface (GUI) to users of WBICD system 100 in the form of Web pages. Such users may access the Web server at the WBICD ASP's site via the Internet (and thus, the World Wide Web) 103. In such an embodiment, because SSL runs on the Internet as well, all points of communication between the users 112 and the ASP's servers 102 would be secure.

While only one gateway 108 is shown in FIG. 1, it will be apparent to one skilled in the relevant art(s) that WBICD system 100 may utilize one or more gateways in a distributed fashion (or possibly mirrored for fault tolerance) connected via LAN 101. In such an embodiment, as will be apparent to one skilled in the relevant art(s) after reading the description herein, each gateway 108 could be dedicated to, and support connections from, a specific type of external client device 112 (and possibly using a different communications network than the global Internet 103).

Lastly, while one database 104 is shown in FIG. 1 for ease of explanation, it will be apparent to one skilled in the relevant art(s) that WBICD system 100 may utilize databases physically located on one or more computers which may or may not be the same as any of servers 102.

More detailed descriptions of WBICD system 100 components, as well as their functionality, are provided below.

III. Application Database

Application database 104 stores the various types of information that WBICD system 100 would need to store in order to provide the integrated circuit design tool of the present invention. Such information, includes user registration information (name, address, billing information, etc.), log-ins, user and group passwords, company information, stored project files, account logs, optimized function libraries for software development, common CVS, reference designs and associated data sheets, etc., as will be apparent to one skilled in the relevant art(s) after reading the teachings herein.

In an embodiment of the present invention, application database 104 is implemented using a relational database product (e.g., Microsoft® Access, Microsoft® SQL Server, IBM® DB2®, ORACLE®, INGRES®, or the like). As is well known in the relevant art(s), relational databases allow the definition of data structures, storage and retrieval operations, and integrity constraints, where data and relations between them are organized in tables. Further, tables are a collection of records and each record in a table possesses the same fields.

In an alternate embodiment of the present invention, application database 104 is implemented using an object database product (e.g., Ode available from Bell Laboratories of Murray Hill, N.J., POET available from the POET Software Corporation of San Mateo, Calif., ObjectStore available from Object Design, Inc. of Burlington, Mass., and the like). As is well known in the relevant art(s), data in object databases are stored as objects and can be interpreted only using the methods specified by each data object's class.

As will be appreciated by one skilled in the relevant art(s), whether application database 104 is an object, relational, and/or even flat-files depends on the character of the data being stored by the ASP which, in turn, is driven by the specific interactive, multi-user applications being offered by the ASP. Server 102 contains specific code logic to assemble components from any combination of these database models and to build the required answer to a query. In any event, gateway 108, computing devices 112, and/or administration workstation 106 are unaware of how, where, or in what format such data is stored.

IV. Software Architecture

In an embodiment of the present invention, servers 102 can be implemented using a Microsoft® Windows NT™ server platform or a Sun Ultra server running the Solaris operating system. Servers 102 execute a (processing) software application implemented in a high level programming language such as, for example, Java or C++. In an embodiment of the present invention, the software application communicates with database 104 using, for example, a C++ object interface.

In an embodiment of the present invention where gateway 108 is a Web sever, a secure GUI "front-end" for WBICD system 100 is provided. In an embodiment of the present invention, the front-end is implemented using the Active Server Pages (ASP), Visual BASIC (VB) script, and JavaScript™ sever-side scripting environments that allow for the creation of dynamic Web pages.

V. Example System Operation

Figure 2:
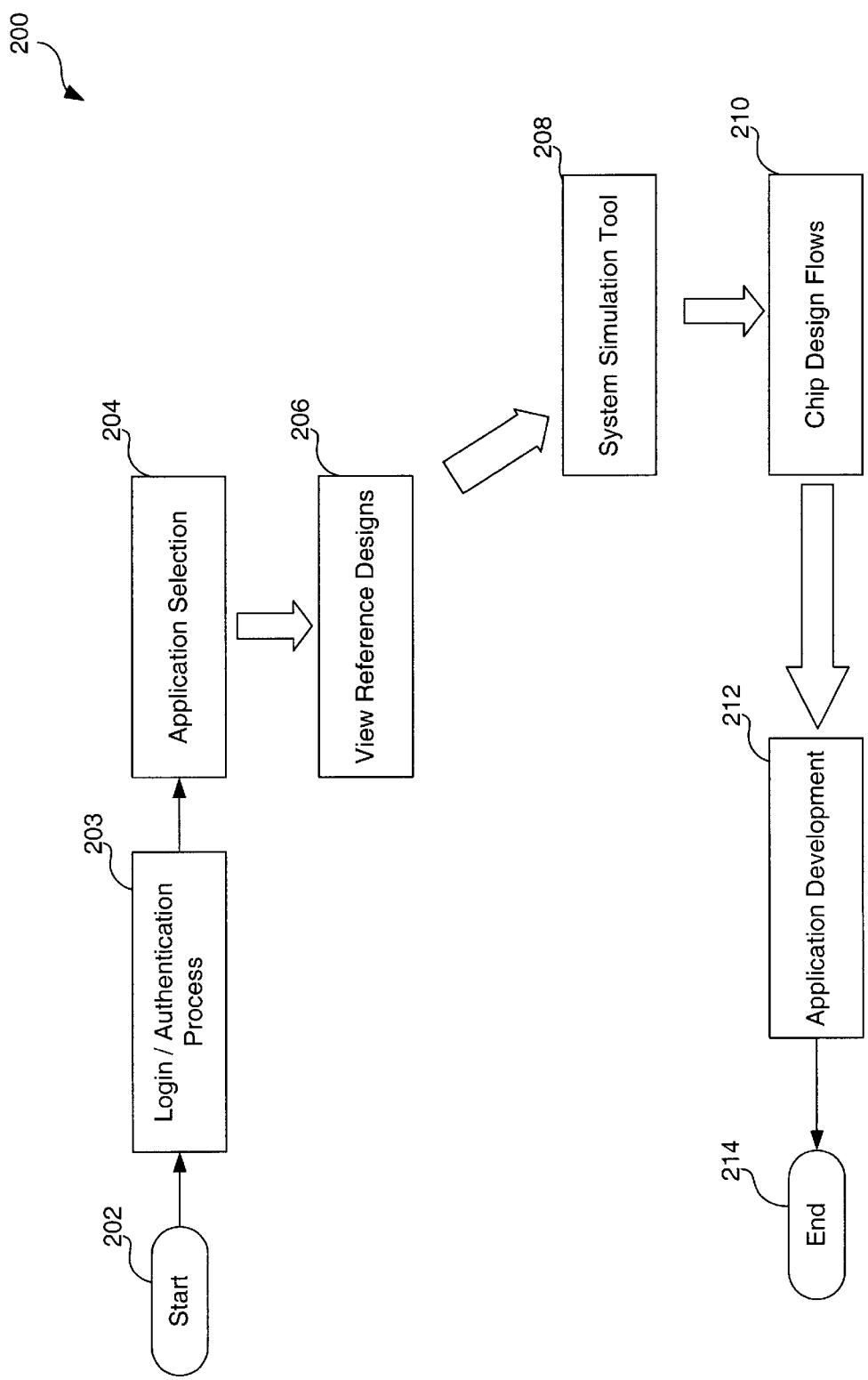
FIG. 2 is a flowchart representing the overall operation according to one embodiment of the present invention.

Referring to FIG. 2, a flowchart depicting an embodiment of the operation and control flow 200 of WBICD system 100 of the present invention is shown. More specifically, control flow 200 depicts, in flowchart form, an example of a design engineer utilizing (via Web navigation) the integrated circuit design tool of the present invention. The description of FIG. 2 is presented with particularized reference to individual WBICD system 100 components. Control flow 200 begins at step 202, with control passing immediately to step 203.

In step 203, an authorized user, employing an external computing device 112, connects to the ASP's gateway 108 and logs in to begin using the "virtual lab" tool of the present invention. Such a login process would include entering a valid user name and password which are then authenticated by the system 100, as will be apparent to one skilled in the relevant art(s).

In step 204, WBICD system 100 allows the user to perform application selection. That is, in step 204, the user (e.g., a design engineer) chooses, via a GUI, the type of product for which they are designing a chip (i.e., start a new design "project"). Such application choices include, without limitation, a set-top box, a voice over Internet Protocol (VoIP) appliance, a Bluetooth appliance, a router, etc.

In step 206, WBICD system 100 allows the user to view a number of reference designs for the particular application selected in step 204. As will be appreciated by one skilled in the relevant art(s), a reference design is a means of recommending a design where one or more parties publish a schematic or other document with a recommendation/endorsement to use its semiconductor integrated circuit products with one or more vendor's semiconductor integrated circuits products or technology. Such reference designs would be made available to the user by the ASP and stored on application database 104. In an embodiment, the ASP, other users, and/or IC manufacturers would make their reference designs available on WBICD system 100.

Figure 3A:
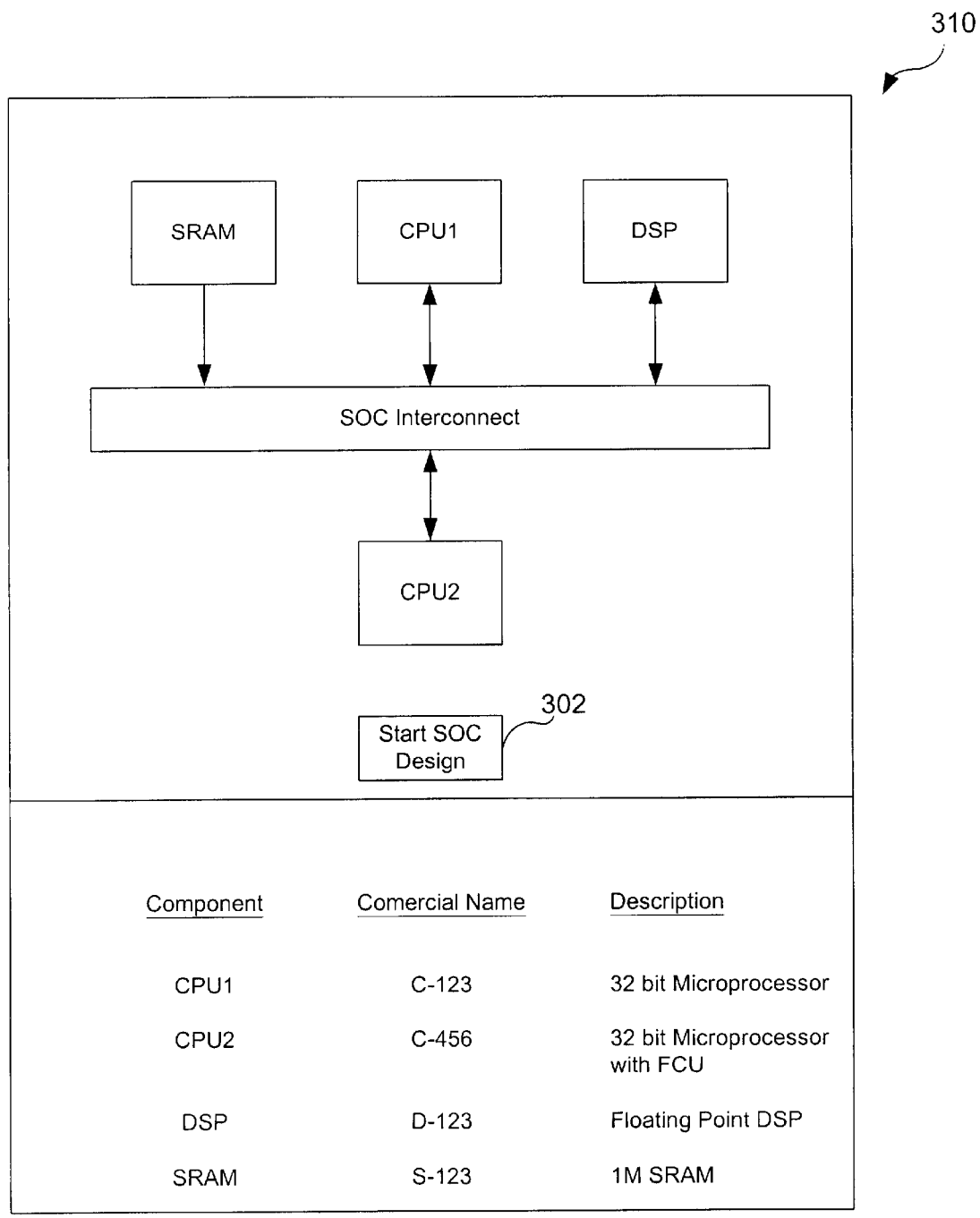
FIGS. 3A–3D are exemplary window or screen shots that could be generated by the graphical user interface of the present invention during the overall operation shown in FIG. 2.

Referring to FIG. 3A, an exemplary window or screen shot 310 that could be generated by the graphical user interface, in the Web site navigation embodiment of the present invention, is shown. The top-half of screen 310 illustrates the GUI presented to the user after selecting, for example, a Bluetooth appliance type application in step 204 and then selecting one of several available reference designs for such an application in step 206. The bottom half of screen 310 displays a list the components (e.g., memory, processors, etc.) within the selected reference design for such an application. In an embodiment, steps 204 and 206 correspond to a portion of the first phase (i.e., system architecture exploration phase) of the chip design process described above.

Once the user decides on an application and chooses among several of the reference designs for that application, a button 302 can be clicked to begin the SOC design process. Control flow 300 then proceeds to step 208.

Returning to control flow 200 (and FIG. 2), in step 208, WBICD system 100 allows the user to access a system simulation tool. In an embodiment, step 208 corresponds to a portion of the first phase (i.e., system architecture exploration phase) and third phase (i.e., design phase) of the chip design process described above. In step 208, WBICD system 100 allows the design engineer to select, simulate and prototype the hardware, software and middleware of the IC product being designed. This step gives the designer feedback about the reference design and the components chosen to implement the reference design, and allows for any desired or necessary re-configuration of the reference design.

Figure 3B:
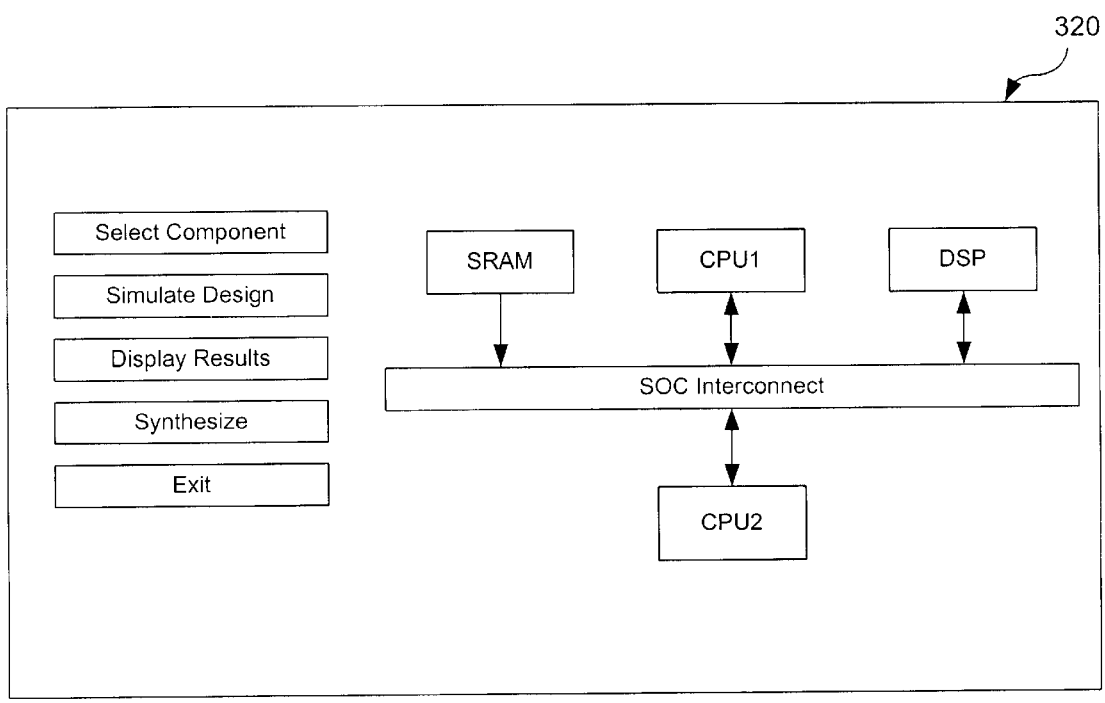
Figure 4:
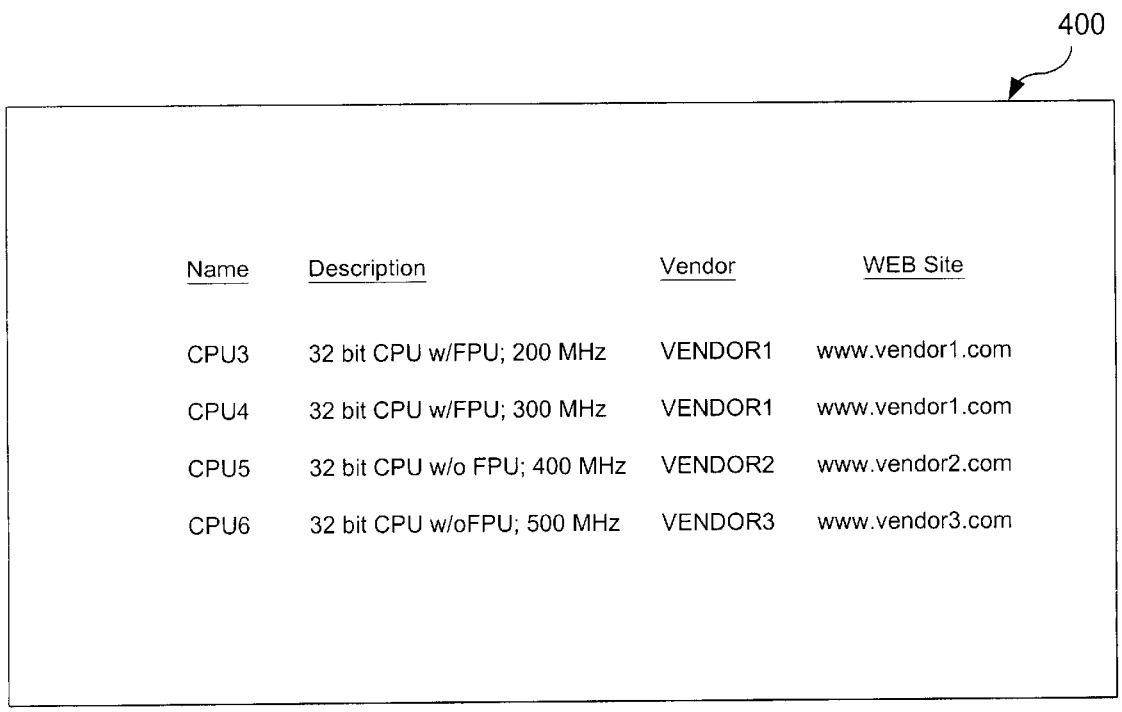
FIG. 4 is an exemplary window or screen shot that could be generated by the graphical user interface in a Web site navigation embodiment of the present invention.

Referring to FIG. 3B, an exemplary window or screen shot 320 that could be generated by the graphical user interface, in the Web site navigation embodiment of the present invention, is shown. Screen 320 illustrates the GUI presented to the user during step 208. Should the user select any component (e.g., by a mouse double-click on the component), WBICD system 100 will display a GUI listing alternate choices for that component, along with a description, name of the supplier or vendor, characteristic information and link to the vendor's Web site. An exemplary GUI screen 400 is shown in FIG. 4 containing such information. Screen 400, in one embodiment, may also include a column of select boxes which would allow a designer to view "side-by-side" comparisons of different components. Once a number of components are selected, a "compare" button on screen 400 (not shown) may be selected in order to view a screen containing more detailed information on the selected components. A return button may be included in each display or screen to return to the SOC design process.

Figure 3C:
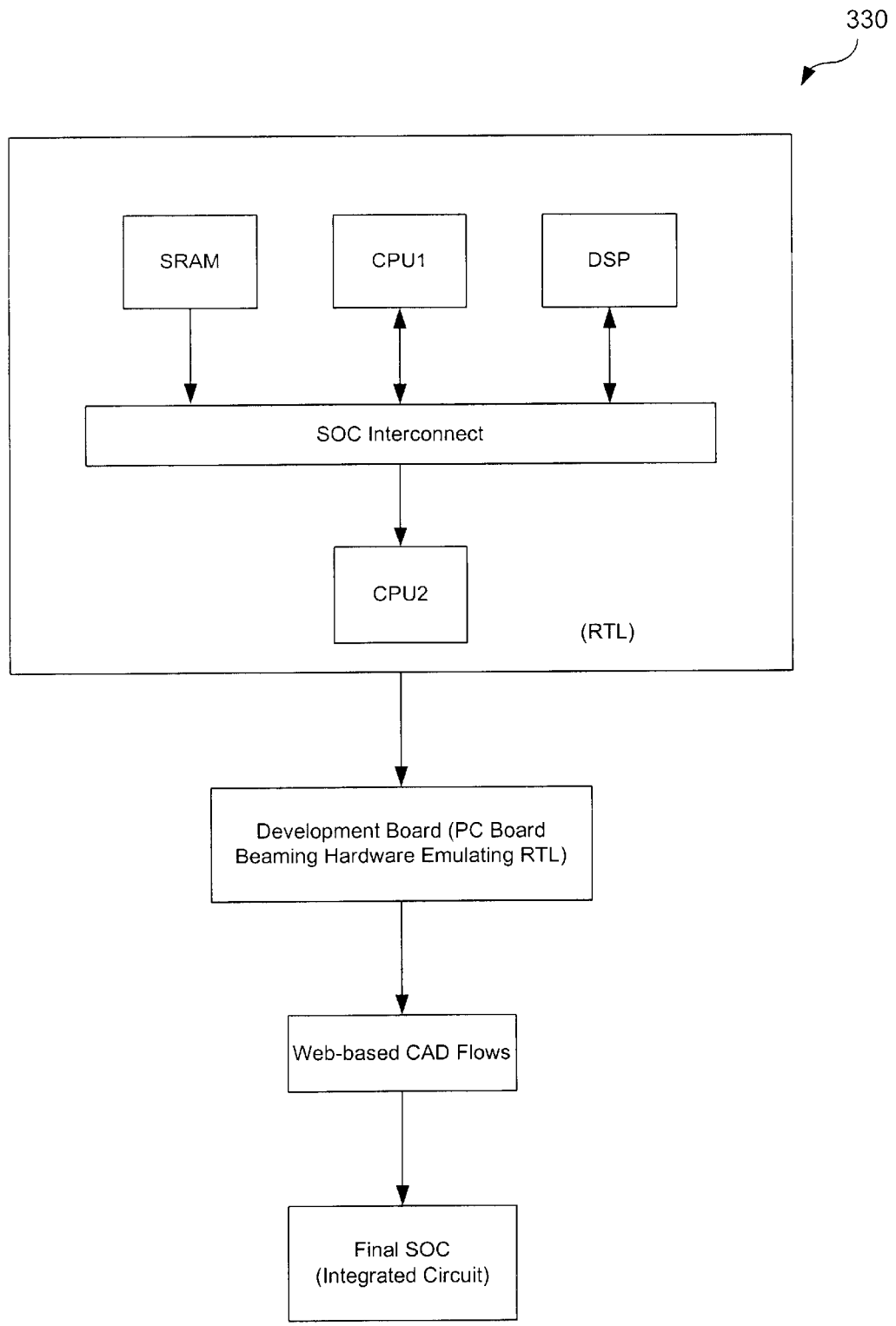

Returning to control flow 200 (and FIG. 2), in step 210, WBICD system 100 allows the user to proceed in the chip design flow process. In an embodiment, step 210 corresponds to portions of the third phase (i.e., design), and the fourth (verification), fifth (synthesis, layout and STA) and sixth (ATPG) phases of the chip design process described above. That is, the user is provided with tools and GUI screens to perform design flows from RTL to GDSII in order to obtain a final SOC, all while having access to emulation tools. An exemplary flow of screens 330 is shown in FIG. 3C.

Figure 3D:
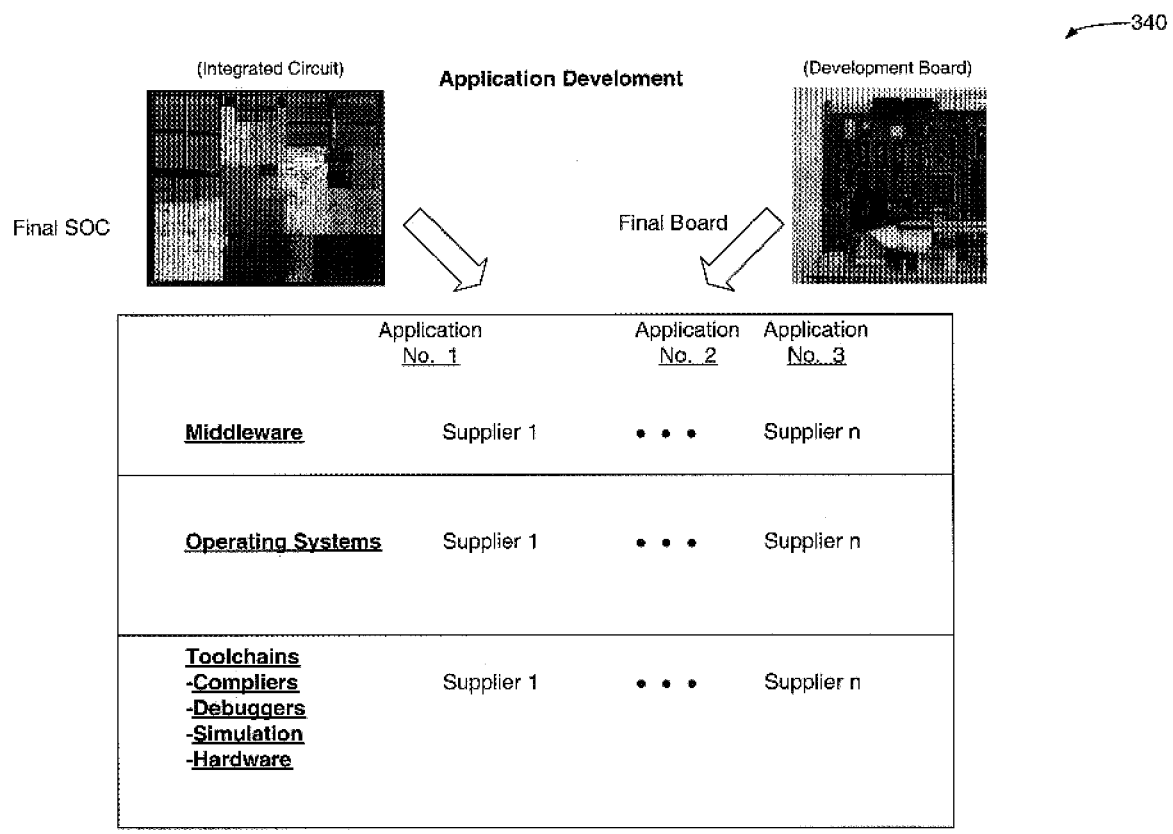

Returning to control flow 200 (and FIG. 2), in step 212, WBICD system 100 allows the user to perform application development. Thus, in an embodiment, step 212 corresponds to the second phase (i.e., software development) of the chip design process described above. That is, WBICD system 100 allows the user access to a variety of compilers and debugger tools to accomplish the software development aspect of the chip design project. In an embodiment, WBICD system 100 allows access to a compilers and debugger tools available from a variety of vendors via a GUI screen. An exemplary screen 340 is shown in FIG. 3D.

Returning to control flow 200 (and FIG. 2), after step 212 is completed, the design project is completed and the chip for the selected application is designed. Control flow 200 then ends as indicated by step 214.

In an embodiment of the present invention, rather than going through the entire design process (i.e., flow 300), a user may decide during the system architecture exploration phase (i.e., during or after steps 204–206) to simply purchase their required chip from a vendor, rather than continuing flow 300 and manufacturing it themselves. In such an instance, WBICD system 100 facilitates such purchase. That is, in an embodiment, WBICD system 100 includes GUI screens that enable the user to "shop" and select an available vendor which can actually manufacture the chip they desire.

It should be understood that control flow 200, which highlights the functionality and advantages of WBICD system 100, is presented for example purposes only. The architecture of the present invention is sufficiently flexible and configurable such that users may utilize WBICD system 100 in ways other than that shown in FIG. 2. Further, the present invention is sufficiently flexible and configurable such that the information contained in the GUI screens of FIGS. 3 and 4 can be presented to users in ways other than those shown in FIGS. 3 and 4.

VI. Environment

Figure 5:
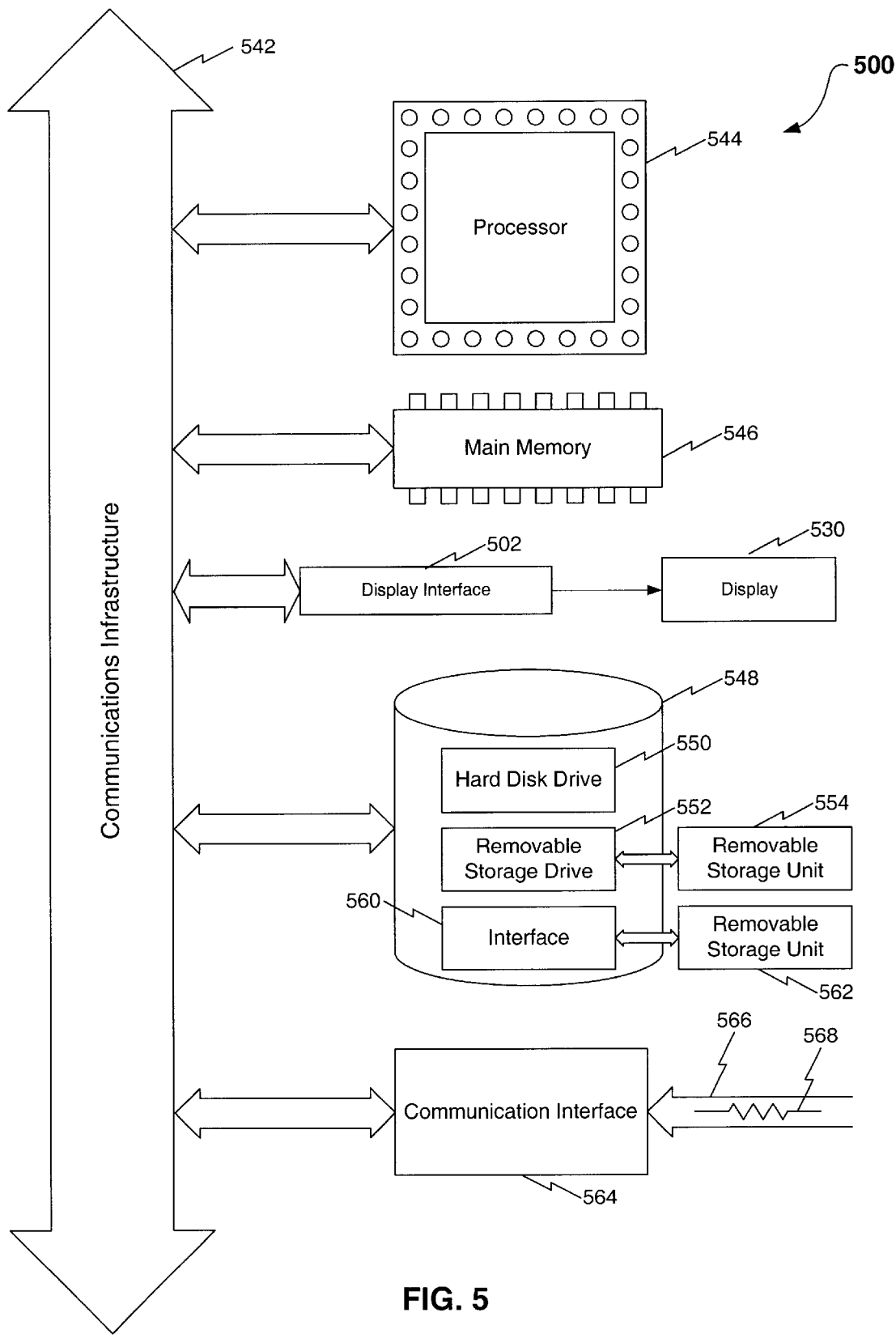
FIG. 5 is a block diagram of an exemplary computer system useful for implementing the present invention.

The present invention (i.e., WBICD system 100, flow 200 or any of the parts thereof) may be implemented using hardware, software or a combination thereof and may be implemented in one or more computer systems or other processing systems. In fact, an example of a computer system 500 is shown in FIG. 5. The computer system 500 represents any single or multi-processor computer. In conjunction, single-threaded and multi-threaded applications can be used. Unified or distributed memory systems can be used. Computer system 500, or portions thereof, may be used to implement the present invention. For example, the System 100 of the present invention may comprise software running on a computer system such as computer system 500.

In one example, the System 100 of the present invention is implemented in a multi-platform (platform independent) programming language such as JAVA™, programming language/structured query language (PL/SQL), hyper-text mark-up language (HTML), practical extraction report language (PERL), common gateway interface/structured query language (CGI/SQL) or the like. Java™-enabled and JavaScript™-enabled browsers are used, such as, Netscape™, HotJava™, and Microsof™ Explorer™ browsers. Active content Web pages can be used. Such active content Web pages can include Java™ applets or ActiveX™ controls, or any other active content technology developed now or in the future. The present invention, however, is not intended to be limited to Java™, JavaScrip™, or their enabled browsers, and can be implemented in any programming language and browser, developed now or in the future, as would be apparent to a person skilled in the relevant art(s) given this description.

In another example, the System 100 of the present invention, may be implemented using a high-level programming language (e.g., C++) and applications written for the Microsoft Windows™ NT or SUN™ OS environments. It will be apparent to persons skilled in the relevant art(s) how to implement the invention in alternative embodiments from the teachings herein.

Computer system 500 includes one or more processors, such as processor 544. One or more processors 544 can execute software implementing the routines described above. Each processor 544 is connected to a communication infrastructure 542 (e.g., a communications bus, cross-bar, or network). Various software embodiments are described in terms of this exemplary computer system. After reading this description, it will become apparent to a person skilled in the relevant art how to implement the invention using other computer systems and/or computer architectures.

Computer system 500 can include a display interface 502 that forwards graphics, text, and other data from the communication infrastructure 542 (or from a frame buffer not shown) for display on the display unit 530.

Computer system 500 also includes a main memory 546, preferably random access memory (RAM), and can also include a secondary memory 548. The secondary memory 548 can include, for example, a hard disk drive 550 and/or a removable storage drive 552, representing a floppy disk drive, a magnetic tape drive, an optical disk drive, etc. The removable storage drive 552 reads from and/or writes to a removable storage unit 554 in a well known manner. Removable storage unit 554 represents a floppy disk, magnetic tape, optical disk, etc., which is read by and written to by removable storage drive 552. As will be appreciated, the removable storage unit 554 includes a computer usable storage medium having stored therein computer software and/or data.

In alternative embodiments, secondary memory 548 may include other similar means for allowing computer programs or other instructions to be loaded into computer system 500. Such means can include, for example, a removable storage unit 562 and an interface 560. Examples can include a program cartridge and cartridge interface (such as that found in video game console devices), a removable memory chip (such as an EPROM, or PROM) and associated socket, and other removable storage units 562 and interfaces 560 which allow software and data to be transferred from the removable storage unit 562 to computer system 500.

Computer system 500 can also include a communications interface 564. Communications interface 564 allows software and data to be transferred between computer system 500 and external devices via communications path 566. Examples of communications interface 564 can include a modem, a network interface (such as Ethernet card), a communications port, interfaces described above, etc. Software and data transferred via communications interface 564 are in the form of signals 568 which can be electronic, electromagnetic, optical or other signals capable of being received by communications interface 564, via communications path 566. Note that communications interface 564 provides a means by which computer system 500 can interface to a network such as the Internet.

The present invention can be implemented using software running (that is, executing) in an environment similar to that described above. In this document, the term "computer program product" is used to generally refer to removable storage unit 554, a hard disk installed in hard disk drive 550, or a carrier wave carrying software over a communication path 566 (wireless link or cable) to communication interface 564. A computer useable medium can include magnetic media, optical media, or other recordable media, or media that transmits a carrier wave or other signal. These computer program products are means for providing software to computer system 500.

Computer programs (also called computer control logic) are stored in main memory 546 and/or secondary memory 548. Computer programs can also be received via communications interface 564. Such computer programs, when executed, enable the computer system 500 to perform the features of the present invention as discussed herein. In particular, the computer programs, when executed, enable the processor 544 to perform features of the present invention. Accordingly, such computer programs represent controllers of the computer system 500.

The present invention can be implemented as control logic in software, firmware, hardware or any combination thereof. In an embodiment where the invention is implemented using software, the software may be stored in a computer program product and loaded into computer system 500 using removable storage drive 552, hard disk drive 550, or interface 560. Alternatively, the computer program product may be downloaded to computer system 500 over communications path 566. The control logic (software), when executed by the one or more processors 544, causes the processor(s) 544 to perform functions of the invention as described herein.

In another embodiment, the invention is implemented primarily in firmware and/or hardware using, for example, hardware components such as application specific integrated circuits (ASICs). Implementation of a hardware state machine so as to perform the functions described herein will be apparent to persons skilled in the relevant art(s) from the teachings herein.

VII. Conclusion

While various embodiments of the present invention have been described above, it should be understood that they have been presented by way of example, and not limitation. For example, the present invention is described above in platform-based SOC design terms, but those skilled in the relevant art(s) will recognize its applicability to block-based SOC design as well. It will also be apparent to persons skilled in the relevant art(s) that various other changes in form and detail may be made therein without departing from the spirit and scope of the invention. This is especially true in light of technology and terms within the relevant art(s) that may be later developed. Thus, the present invention should not be limited by any of the above-described exemplary embodiments, but should be defined only in accordance with the following claims and their equivalents.

What is claimed:

1. A system for integrated circuit design, comprising:
    (a) an application database that stores information about a reference design for an integrated circuit;
    (b) a plurality of servers, each connected to said application database;
    (c) a Web server, connected to said plurality of servers, that services connections from a plurality of user machines over the Internet; and
    (d) means for allowing said plurality of user machines to remotely perform at least the following phases of the design via a graphical user interface by communicating with one of said plurality of servers and said application database, via said Web server: (i) system architecture exploration; (ii) software development; (iii) circuit design; (iv) verification; and (v) synthesis, layout and static timing analysis.

2. The system of claim 1, wherein said phases further comprise auto test pattern generation.

3. The system of claim 1, wherein said phase of software development further comprises application development.

4. The system of claim 3, wherein said application development further comprises accessing debugger tools.

5. The system of claim 3, wherein said application development further comprises accessing compiler tools.

6. A system for integrated circuit design, comprising:
(a) an application database that stores information about a list of design components for integrated circuits;
(b) a plurality of servers, each connected to said application database;
(c) a Web server, connected to said plurality of servers, that services connections from a plurality of user machines over the Internet; and
(d) means for allowing said plurality of user machines to remotely perform at least the following phases of integrated circuit design via a graphical user interface by communicating with one of said plurality of servers and said application database, via said Web server: (i) system architecture exploration; (ii) software development; (iii) design; (iv) verification; and (v) synthesis, layout and static timing analysis.

7. The system of claim 6, wherein said phases further comprise auto test pattern generation.

8. The system of claim 6, wherein said phase of software development further comprises application development.

9. The system of claim 8, wherein said application development further comprises accessing debugger tools.

10. The system of claim 8, wherein said application development further comprises accessing compiler tools.

11. A system for allowing a user to perform integrated circuit by using only a single application, comprising:
(a) an application database that stores information about a reference design for an integrated circuit;
(b) a server connected to said application database;
(c) a Web server, connected to said server, that services connections from a client device used by the user over the Internet;
(e) a graphical user interface that is provided to the user on said client device by said Web server;
(f) a system simulation tool, accessible via said graphical user interface, that allows the user to select, simulate and prototype the hardware, software and middleware of an integrated circuit being designed;
(g) a chip design flow tool, remotely accessible via said graphical user interface, that allows the user to perform register transfer level design, verification, synthesis, layout and static timing analysis of said integrated circuit being designed; and
(h) a compiler and debugger tool, accessible via said graphical user interface, that facilitates the software development of said integrated circuit being designed.

12. The system of claim 11, wherein said software development further comprises application development.

13. A system for allowing a user to perform integrated circuit design by using only a single application, comprising:
(a) an application database that stores information about a list of design components for integrated circuits;
(b) a server connected to said application database;
(c) a Web server, connected to said server, that services connections from a client device used by the user over the Internet;
(e) a graphical user interface that is provided to the user on said client device by said Web server;
(f) a system simulation tool, accessible via said graphical user interface, that allows the user to select, simulate and prototype the hardware, software and middleware of an integrated circuit being designed;
(g) a chip design flow tool, remotely accessible via said graphical user interface, that allows the user to perform register transfer level design, verification, synthesis, layout and static timing analysis of said integrated circuit being designed; and
(h) a compiler and debugger tool, accessible via said graphical user interface, that facilitates the software development of said integrated circuit being designed.

14. The system of claim 13, wherein said software development further comprises application development.

15. A method for allowing a user to perform integrated circuit design by using only a single application, comprising the steps of:
(1) receiving from the user a selection indicative of an application for which the user is designing an integrated circuit;
(2) retrieving a plurality of reference designs for said application from a database, in response to said application selection;
(3) displaying, via a graphical user interface, said plurality of reference designs for said application;
(4) receiving from the user, via said graphical user interface, a selection indicating one of said plurality of reference designs;
(5) providing the user, via said graphical user interface, a system simulation tool that allows the user to select, simulate and prototype the hardware, software and middleware, using said selected reference design, of said integrated circuit being designed;
(6) providing the user, via said graphical user interface, a chip design flow tool that allows the user to perform register transfer level design, verification, synthesis, layout and static timing analysis of said integrated circuit being designed; and
(7) providing the user, via said graphical user interface, access to at least one compiler and debugger tool in order to facilitate the software development of said integrated circuit being designed;
whereby the user remotely performs all phases of integrated circuit design, from conception to tape-out, via said graphical user interface.

16. The system of claim 15, wherein said software development further comprises application development.

17. A method for allowing a user to perform integrated circuit design by using only a single application, comprising the steps of:
(1) receiving from the user a selection indicative of an application for which the user is designing an integrated circuit;
(2) retrieve a list of design components for said application from a database, in response to said application selection;
(3) displaying, via a graphical user interface, said list of design components for said application;
(4) receiving from the user, via said graphical user interface, a selection indicating at least one of said list of design components;
(5) providing the user, via said graphical user interface, a system simulation tool that allows the user to select, simulate and prototype the hardware, software and middleware, including said at least one of said list of design components, of said integrated circuit being designed;
(6) providing the user, via said graphical user interface, a chip design flow tool that allows the user to perform register transfer level design, verification, synthesis, layout and static timing analysis of said integrated circuit being designed; and (7) providing the user, via said graphical user interface, access to at least one compiler and debugger tool in order to facilitate the software development of said integrated circuit being designed;

whereby the user remotely performs all phases of integrated circuit design, from conception to tape-out, via said graphical user interface.

18. The method of claim 17, wherein said software development further comprises application development.

19. A computer program product comprising a computer usable medium having control logic stored therein for causing a computer to allow a user to perform integrated circuit design by using only a single application, said control logic comprising:

first computer readable program code means for causing the computer to receive from the user a selection indicative of an application for which the user is designing an integrated circuit;

second computer readable program code means for causing the computer to access a database, in response to said application selection, in order to retrieve a plurality of reference designs for said application;

third computer readable program code means for causing the computer to display, via a graphical user interface, said plurality of reference designs for said application;

fourth computer readable program code means for causing the computer to receive from the user, via said graphical user interface, a selection indicating one of said plurality of reference designs;

fifth computer readable program code means for causing the computer to provide the user, via said graphical user interface, a system simulation tool that allows the user to select, simulate and prototype the hardware, software and middleware, using said selected reference design, of said integrated circuit being designed;

sixth computer readable program code means for causing the computer to provide the user, via said graphical user interface, a chip design flow tool that allows the user to perform register transfer level design, verification, synthesis, layout and static timing analysis of said integrated circuit being designed; and seventh computer readable program code means for causing the computer to provide the user, via said graphical user interface, access to at least one compiler and debugger tool in order to facilitate the software development of said integrated circuit being designed;

whereby the user remotely performs all phases of integrated circuit design, from conception to tape-out, via said graphical user interface accessed over the Internet.

20. The product of claim 19, wherein said software development further comprises application development.

21. A computer program product comprising a computer usable medium having control logic stored therein for causing a computer to allow a user to perform integrated circuit design by using only a single application, said control logic comprising:

first computer readable program code means for causing the computer to receive from the user a selection indicative of an application for which the user is designing an integrated circuit;

second computer readable program code means for causing the computer to access a database, in response to said application selection, in order to retrieve a list of design components for said application;

third computer readable program code means for causing the computer to display, via a graphical user interface, said list of design components for said application;

fourth computer readable program code means for causing the computer to receive from the user, via said graphical user interface, a selection indicating at least one of said list of design components;

fifth computer readable program code means for causing the computer to provide the user, via said graphical user interface, a system simulation tool that allows the user to select, simulate and prototype the hardware, software and middleware, including said at least one of said list of design components, of said integrated circuit being designed;

sixth computer readable program code means for causing the computer to provide the user, via said graphical user interface, a chip design flow tool that allows the user to perform register transfer level design, verification, synthesis, layout and static timing analysis of said integrated circuit being designed; and seventh computer readable program code means for causing the computer to provide the user, via said graphical user interface, access to at least one compiler and debugger tool in order to facilitate the software development of said integrated circuit being designed;

whereby the user remotely performs all phases of integrated circuit design, from conception to tape-out, via said graphical user interface accessed over the Internet.

22. The product of claim 21, wherein said software development further comprises application development.

* * * * *

UNITED STATES PATENT AND TRADEMARK OFFICE
CERTIFICATE OF CORRECTION

PATENT NO.     : 6,742,165 B2
DATED          : May 25, 2004
INVENTOR(S)    : Lev et al.

Page 1 of 1

It is certified that error appears in the above-identified patent and that said Letters Patent is hereby corrected as shown below:

Title page,
Item [56], References Cited, OTHER PUBLICATIONS, the following should be listed:

Santarini, M., "Synopsys and Avanti Roll Out Virtual Design Shop", EE Times, June 1, 2000, retrieved from the Internet on July 16, 2003:<URL:http://www.eedesign.com/story/OEG20000601S0021>, 3 pages.

Goering, R. and Santarini, M., "Web To Bring SoC Tools To The Masses", The Electronics Design, Technology & News Network, June 5, 2000, retrieved from the Internet on July 16, 2003: <URL:http://www.edtn.com/story/ OEG20000604S0004>, 9 pages.

Steffora, A., "Design Reuse Becoming a Reality?", Electronic News, June 14, 1999, retrieved from the Internet on July 29, 2003: <URL:http://www.reed-electronics.com/electronicnews/index.asp?layout+article&articleid+CA70999&rid+0&rme+0&cfd=1>, 3 pages.

Cordan, B., "Goal is User-Configurable SIP with Web-Based EDA Environment", Electronic News, Palmchip Corp, January 31, 2000, retrieved from the Internet on July 16, 2003: <URL:http://www.e-insite.net/ electronicnews/index/asp?layout=articlePrint&articleID=CA48782>, 2 pages.

Goering, R., "IP99: Synopsys Readies IP-Reuse Tools", EE Times, March 19, 1999, retrieved from the Internet on July 17, 2003: <URL:http://www.eetimes.com/story/OEG19990319S0006>, 2 pages.

Cordan, B. and Rao, A., "Developing Configurable IP for System-on-Chip", DesignCom200, IP World Forum, 2000, 16 pages.

Author unknown, "coreConsultant User Guide", Version 199.05, August 1999, pp. iii through xxiv, 1-1 through 8-64 and GL1 through GL-2.

"Sonics Announces SOCworks.com, First Dynamic B2B Exchange For The SOC Marketplace, 20+ Leading Vendors Collaborate to Speed SOC Commerce; TSMC, World's", June 5, 2000, retrieved from the Internet on July 16, 2003: <URL:http://www.sonicsinc.com/sonics/news/pressreleases/data/ pr_2000_06_05%20/viewPR.html>, 5 pages.

"Welcome to SOCworks", retrieved from the Internet on July 16, 2003: <URL:http://www.socworks.com/socworks/index_html>, 17 pages.

"Sonics home page with product descriptions", 2000-2003, retrieved from the Internet July 16, 2003: <URL:http://www.sonicsinc.com/sonics/index_html>, 19 pages.

"Virtio home page with product descriptions", 1999-2003, retrieved from the Internet July 16, 2003: <URL:http://www.virtio.com/home_new>, 14 pages.

CoreCreator Information Sheet, OCP-IP Association, 2001, 2 pages.

Signed and Sealed this

Twenty-first Day of June, 2005

JON W. DUDAS
*Director of the United States Patent and Trademark Office*